(12) United States Patent
Osaka

(10) Patent No.: US 7,505,285 B2
(45) Date of Patent: Mar. 17, 2009

(54) MAIN BOARD FOR BACKPLANE BUSES

(75) Inventor: Hideki Osaka, Oiso (JP)

(73) Assignee: Hitachi, Ltd., Tokyo (JP)

( * ) Notice: Subject to any disclaimer, the term of this patent is extended or adjusted under 35 U.S.C. 154(b) by 163 days.

(21) Appl. No.: 11/404,912

(22) Filed: Apr. 17, 2006

(65) Prior Publication Data
US 2006/0232949 A1 Oct. 19, 2006

(30) Foreign Application Priority Data
Apr. 18, 2005 (JP) ............... 2005-119304

(51) Int. Cl.
*H01R 12/16* (2006.01)
(52) U.S. Cl. ................... 361/788; 174/255
(58) Field of Classification Search ........... 361/788; 174/255
See application file for complete search history.

(56) References Cited

U.S. PATENT DOCUMENTS

| | | | |
|---|---|---|---|
| 6,812,803 B2* | 11/2004 | Goergen | 333/1 |
| 7,148,428 B2* | 12/2006 | Meier et al. | 174/260 |
| 7,253,788 B2* | 8/2007 | Choi et al. | 343/909 |
| 2005/0205292 A1 | 9/2005 | Rogers et al. | |
| 2007/0215913 A1* | 9/2007 | Okubora | 257/275 |
| 2008/0000677 A1* | 1/2008 | Lai et al. | 174/261 |

FOREIGN PATENT DOCUMENTS

| | | |
|---|---|---|
| JP | 9-275278 | 10/1997 |
| JP | 2000-183541 | 6/2000 |
| JP | 2000-216586 A | 8/2000 |
| JP | 2000-223800 A | 8/2000 |
| JP | 2001-127387 | 5/2001 |

OTHER PUBLICATIONS

"Power Delivery Isolation Methods in Integrated Mixed Signal Systems", M. Swaminathan, et al., Georgia Institute of Technology. EDAPS 04.

* cited by examiner

*Primary Examiner*—Tuan T Dinh
*Assistant Examiner*—Yuriy Semenenko
(74) *Attorney, Agent, or Firm*—Mattingly, Stanger, Malur & Brundidge PC

(57) ABSTRACT

A motherboard for backplane buses is provided that reduces noise due to entry of external signals into signal wiring which interconnects modules, or noise due to any external signals entering a power supply after being routed around the power supply.

An EBG pattern formed up of two wiring regions different from each other in impedance is periodically disposed in at least three arrays as part of the power supply layer(s) constituting a microstripline structure (one layer adjacent to a signal layer is a power supply layer, and the other layer is interposed in air) or a stripline structure (both layers adjacent to a signal layer are power supply layers); the part of the power supply layer(s) not being involved in signal transmission between the modules on the motherboard for backplane buses.

8 Claims, 13 Drawing Sheets

FREQUENCY [Hz]

EBG PATTERN

MAIN BOARD FOR BACKPLANE BUSES

CLAIM OF PRIORITY

The present application claims priority from Japanese application JP 2005-119304, filed on Apr. 18, 2005, the content of which is hereby incorporated by reference into this application.

BACKGROUND OF THE INVENTION

1. Field of the Invention

The present invention relates generally to main boards for backplane buses. The invention also relates to a bus connection technique used for personal computers, servers, routers, and other information-processing units in order to interconnect functional circuits such as a processor and a memory. More particularly, the invention relates to a main board for backplane buses, suitable for reducing radio-frequency noise.

2. Description of the Related Art

One of the problems encountered in transmitting digital signals of a 10-Gbps (gigabits per second) class is that the signal waveforms become disturbed. This problem arises from electrical restrictions on the printed-circuit board that constitutes wiring. That is to say, the above is because metallic wiring attenuates signals by a skin effect more significantly at higher frequencies and because the dielectrical losses in insulators also cause more significant signal attenuation at higher frequencies. These factors have frequency dependence and cause more significant attenuation at higher frequencies.

For backplane buses, their main board (also referred to as a motherboard; the term "motherboard" is used in the remainder of this Specification) has a large quantity of wiring routed to interconnect the modules (sub-boards or daughter boards) mounted on the motherboard. For intermodule wiring, even if a single module undertakes both transmitting and receiving functions, a plurality of signal lines exist, and providing a plurality of signal lines ensures favorable signal transmission throughput. Using 20 bits of 10-Gbps signal data, for example, allows a transfer rate of 200 Gbps to be achieved. The 20-bit signal wiring length in this case is almost equal.

In addition, 1:1 intermodule high-speed signal connection is used for backplane buses, in which case, a plurality of combinations are possible and 12 wiring formats are available for four modules, for example This means the same combination as that of retrieving two from four. For backplane buses, therefore, there are a set of signals of the same wiring length for transmitting signals between modules of the same specifications, and a set of signals of different wiring lengths according to a particular combination of modules.

Timing also differs between the sets of signals. Even during transfer between the modules having a plurality of signals, although signal transmission between modules of the same specifications is usually synchronous, the transmission timing of the signals differs from that of signal wiring for other module combinations. Accordingly, focusing attention on one signal wiring section allows one to see that crosstalk noise, power-supply bounce noise, or other forms of asynchronous noise are propagated with other intermodule transmission signals as their noise sources.

Since the transmission signal itself suffers significant attenuation at high frequencies, the signal-to-noise ratio (S/N ratio) deteriorates in a high-frequency band and an appropriate S/N ratio in a high-frequency band must be achieved to ensure stable operation.

In this context, the noise occurring on the circuit boards of electronic devices is a big problem. In connection with this problem, a method of suppressing noise propagation between any two elements efficiently is shown in, for example, the following Non-Patent Reference 1:

A method of reducing the analog-to-digital signal interference shown in Non-Patent Reference 1 will be outlined hereunder with reference to FIGS. 19 to 22.

FIG. 19 is a cross-sectional view of the analog-to-digital signal mixed circuit board for signal-to-signal noise cutoff, based on a conventional technique.

FIG. 20 is a top view of the power supply layer of the analog-to-digital signal mixed circuit board for signal-to-signal noise cutoff, based on the conventional technique.

FIG. 21 is a view showing the EBG pattern of the above analog-to-digital signal mixed circuit board for cutting off signal-to-signal noise.

FIG. 22 is a graph that represents power supply noise propagation levels in a certain frequency band, or propagation losses between analog part and digital part.

FIG. 19 is a cross-sectional view of a circuit board showing a typical example of an analog-to-digital (A-D) signal mixed circuit composition. In FIG. 19, the analog circuit 101 connected to a radio-frequency (RF) antenna 103 has a wide dynamic range. A digital signal processor (DSP) 102 is connected to the analog circuit 101 and processes digitized signals. The analog circuit 101 and the digital circuit 102 are both mounted on a printed-wiring circuit 110.

The analog circuit 101 has a wide dynamic range so as to be able to handle both of very weak receiver signals and strong transmitter signals. This dynamic range is, for example, from 40 to 60 dB for use in an apparatus having a wireless function. For this reason, the noise generated by the digital circuit 102 such as the DSP, enters the analog circuit 101 and deteriorates the characteristics of the circuit 101. Non-Patent Reference 1 discloses a method of suppressing the entry or propagation of the noise. In this Reference, the electromagnetic bandgap (EBG) pattern denoted by a reference number 50 is periodically constructed in the power supply ground layer that is the inner layer of the printed-wiring circuit 110. In this way, the noise propagation can be suppressed.

In Non-Patent Reference 1, the EBG pattern is, as shown in FIG. 21, constructed as a combination of two metallic patterns of different sizes, namely, a small pattern 50-1 and a large pattern 50-2. These patters are arranged in a periodic format to construct the EBG pattern. The interspace between the analog circuit 101 and analog circuit 102 of the power supply layer in the printed-wiring board 110 is lined with the EBG pattern to suppress the noise propagation in a high-frequency range while at the same permitting a direct current (DC) to flow through. In other words, the EBG pattern is a pattern constructed by periodic arrangement of electrical lines different in impedance.

An example of power supply noise propagation levels at certain frequencies in the above case is shown in FIG. 22. In FIG. 22, the ratio of noise propagation between the analog circuit 101 and digital circuit 102 in FIG. 20 is represented on a vertical axis, and it can be seen that the pattern has significant noise suppression bandgap characteristics of −60 dB at frequencies from 3 GHz to 7 GHz.

[Patent Reference 1] Japanese Laid-Open Patent Application Publication (JP Kokai) No. 2000-216586

[Patent Reference 2] JP Kokai No. 2000-223800

[Patent Reference 3] JP Kokai No. 2000-183541

[Patent Reference 4] JP Kokai No. H09-275278

[Patent Reference 5] JP Kokai No. 2001-127387

[Non-Patent Reference 1] Madhavan Swaminathan, et al., "Power Delivery Isolation Methods in Integrated Mixed Signal Systems," Proc. of Electrical Design of Advanced Packaging and Systems (EDAPS) workshop, pp. 1-17, Nov. 29, 2004.

The technology disclosed in above Non-Patent Reference 1 is effective for reducing AC-component-induced noise by embedding an EBG pattern in the circuit board.

However, if the power supply layer and the ground layer are arranged in opposed form as in a motherboard for backplane buses, the consequent composition of a resonator between the two layers presents the problem that power supply noise superimposition on signals occurs at a resonance frequency. The superimposition, in turn, poses the problem of increased electromagnetic radiation noise. In above-described Patent Reference 1, for example, a method of reducing electromagnetic noise by curvilinearly slitting the power supply layer of a multilayer circuit board is also disclosed as a solution to the above. However, although the use of this noise reduction method makes it possible to change the resonance frequency of opposed power supply layers, this method cannot be directly applied to a motherboard for backplane buses. This is because, for a split motherboard originally having a large area, a higher-order resonance frequency occurs and this causes high-frequency noise to enter data signals. That is to say, resonance occurs in each split power supply area and the frequency in this case could increase to as high as twice the original resonance frequency.

In addition, if signal layers are arranged vertically so as to straddle the slits in the power supply (ground) layer, the feedback currents of the signals are necessitated to detour the slits and these detour currents deteriorate S/N ratios. Methods of solving this problem are described in above Patent References 2, 3.

In Patent Reference 2, the occurrence of noise due to the detouring feedback currents flowing near the slits is successfully suppressed, but noise reduction between signals is not described. In Patent Reference 3, in order to suppress the resonance due to the slits, the resonance frequency is shifted by placing in the power supply layer a ground plane which is via-connected to the ground layer, and by splitting the power supply pattern of the power supply layer and combining this pattern with a decoupling capacitor. The amount of shift of the resonance frequency is controlled for a drift from the higher-order clock frequency that is a noise excitation source. The technology described in Patent Reference 3, however, is intended to suppress noise due to electromagnetic radiation to a space, and no description is given of signal-to-signal noise suppression effects.

Additionally, above-described Patent Reference 4 discloses the composition and design method of the printed-circuit board for reducing the electromagnetic radiation noise propagated from slits, but this Reference does not describe internode noise reduction, as with Patent Reference 3.

Furthermore, although above-described Patent Reference 5 discloses the composition of the power supply in the printed-circuit board for reducing the electromagnetic radiation noise propagated from slits, this Reference does not describe internode noise reduction, as with Patent Reference 3.

Above-described Patent References 2 to 5 relate to the techniques for slitting the power supply layer of a circuit board. With any one of these techniques alone, it is insufficient for reducing signal noise in the current circuit boards that are coming to handle high-frequency signals most commonly. In other words, these techniques only allow signal noise to be cut off in narrow frequency bands and at small voltage ratios.

SUMMARY OF THE INVENTION

The present invention has been made for solving the above problems, and an object of the invention is to provide a motherboard for backplane buses that is to be used for electronic devices, this motherboard being capable of reducing noise due to entry of external signals into signal wiring which interconnects modules, or noise due to any external signals entering a power supply after being routed therearound. More particularly, the invention is intended to provide a motherboard for backplane buses that is able to offer a favorable S/N ratio at 3-5 GHz.

In order to solve the above problems, the present invention forms an EBG pattern in part of a power supply layer not involved in signal transmission between modules of a motherboard for backplane buses that is intended for mounting a plurality of sub-boards via connectors.

That is to say, in a motherboard with either a wiring structure (microstripline structure:MSL structure) including signal layers to provide signal wiring between connectors, wherein one of the signal layers adjacent to each other is interposed between power supply layers, and the other adjacent signal layer is interposed in air, or a wiring structure (stripline structure:SL structure) in which both of the adjacent signal layers are each interposed between power supply layers, a periodic wiring structure is provided in which a pattern formed up of two wiring regions of different impedances is periodically disposed in at least three arrays in a portion of the power supply layers constituting the microstripline structure or the stripline structure, the power supply layer portion being a section interposed between the connectors. This periodic wiring structure is formed so as not to adjacently have the signal wiring of the signal layer.

Constructing the motherboard in this way makes it possible for the noise propagated between the power supply layers with respect to a desired signal to be reduced in a specific frequency band (3-5 GHz) while the EBG pattern is maintaining a direct current. More particularly, such construction is contributive to suppressing the crosstalk noise and power supply noise generated by the signals asynchronously transmitted between other modules.

According to the present invention, it is possible to provide a motherboard for backplane buses that is to be used for electronic devices, this motherboard being capable of reducing noise due to entry of external signals into signal wiring which interconnect modules, or noise due to any external signals entering a power supply after being routed therearound. More particularly, it is possible to provide a motherboard for backplane buses that is able to offer a favorable S/N ratio at 3-5 GHz.

DESCRIPTION OF THE PREFERRED EMBODIMENTS

Embodiments of the present invention will be described hereunder with reference to FIGS. 1 to 16.

First Embodiment

A first embodiment of the present invention is described below with reference to FIGS. 1 to 9.

Figure 1:
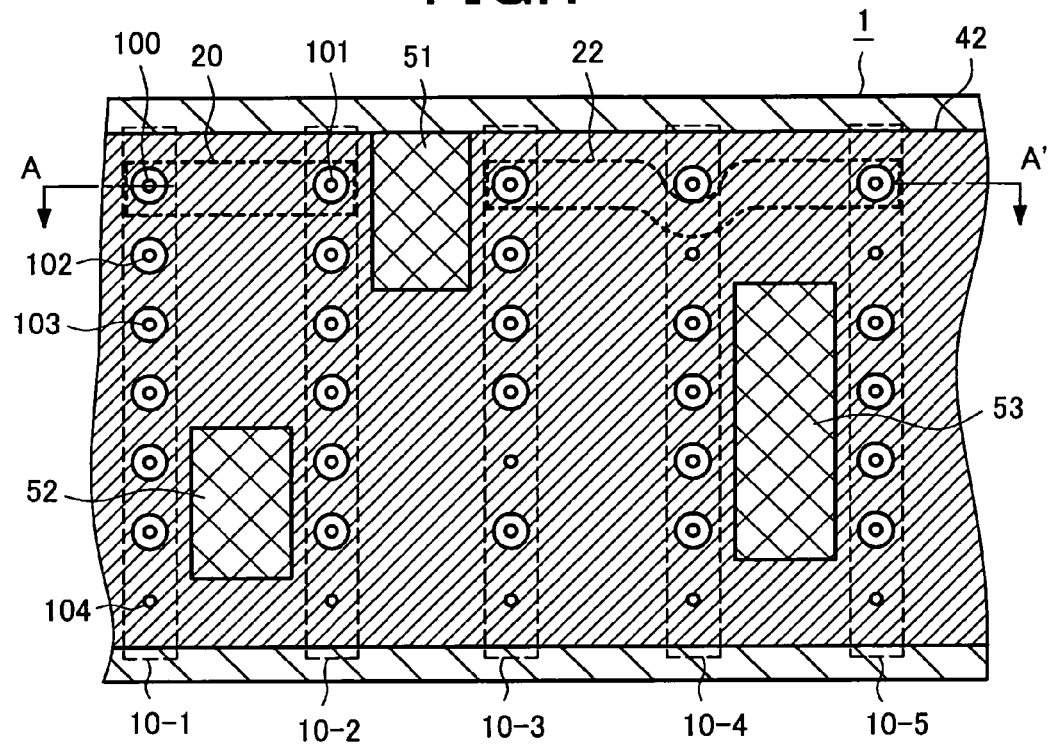
FIG. 1 is a horizontal cross-sectional view showing in part a power supply layer 42 of a motherboard for backplane buses according to a first embodiment of the present invention.
Figure 2:
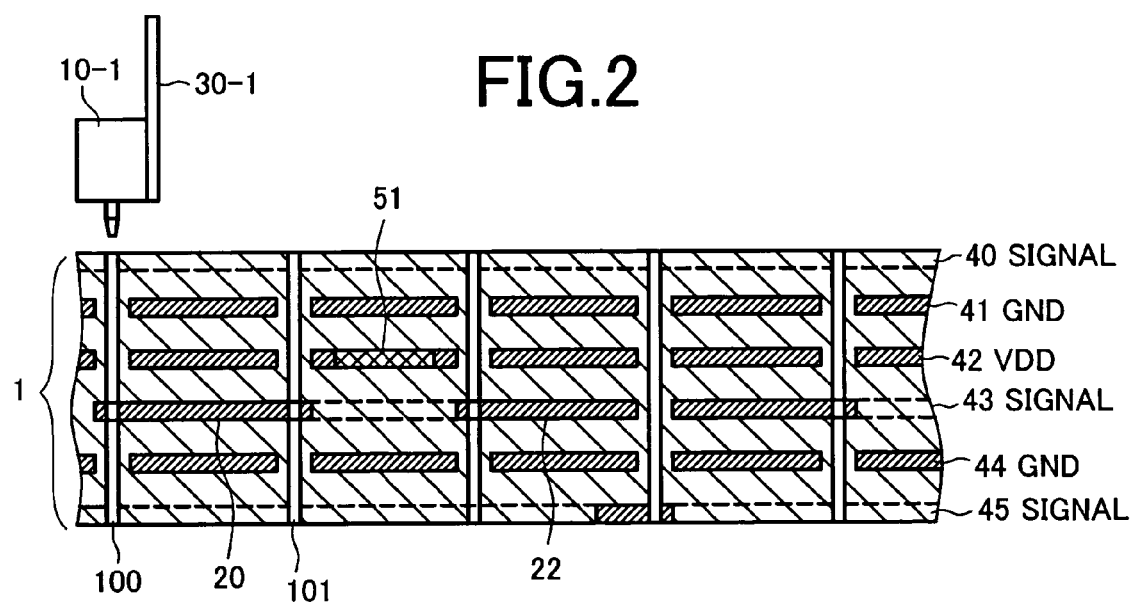
FIG. 2 is a vertical cross-sectional view that shows section A-A' of the above motherboard.

FIG. 1 is a horizontal cross-sectional view of a motherboard for backplane buses according to the first embodiment of the present invention, showing a section extending along a power supply layer 42 (see FIG. 2).

FIG. 2 is a vertical cross-sectional view that shows section A-A' of the above motherboard for backplane buses.

Figure 3:
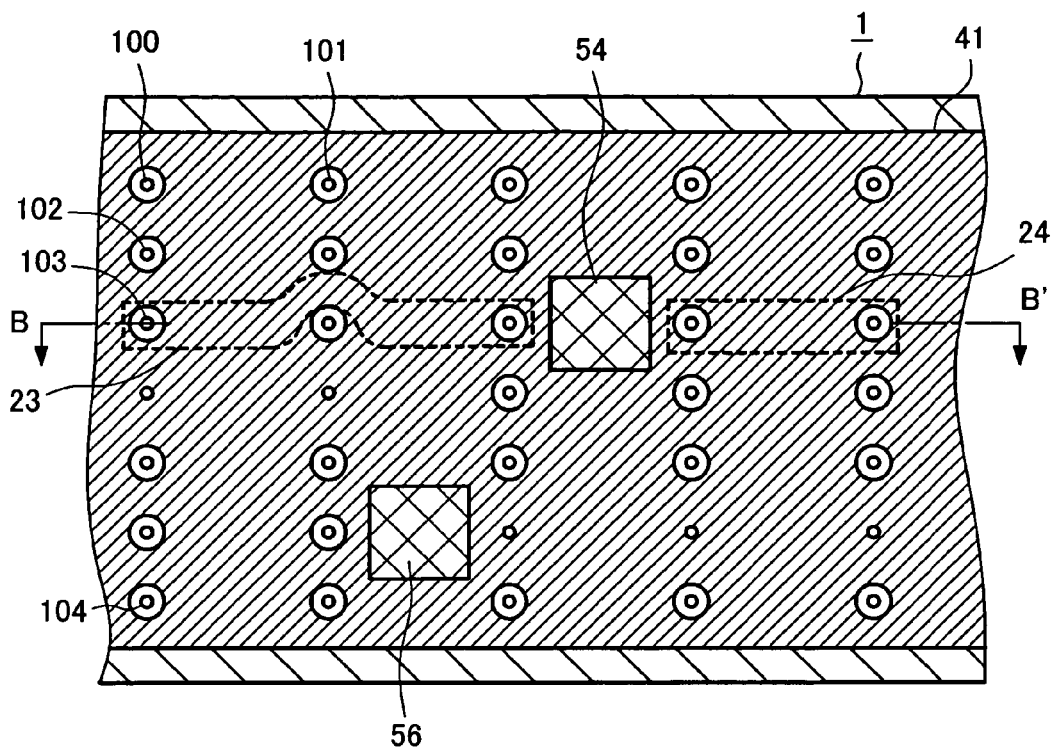
FIG. 3 is a horizontal cross-sectional view showing in part a ground layer 41 of the above motherboard.

FIG. 3 is a horizontal cross-sectional view of the above motherboard for backplane buses, showing a section extending along a ground layer 41.

Figure 4:
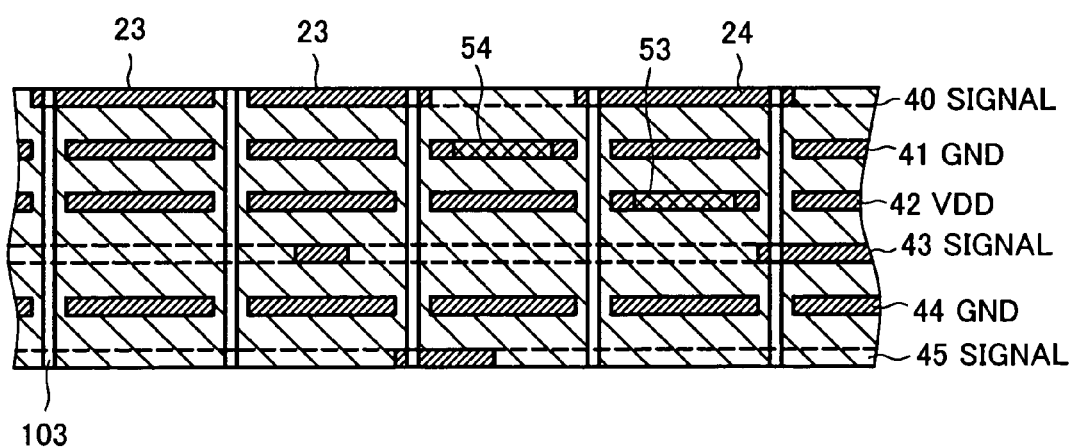
FIG. 4 is a vertical cross-sectional view that shows section B-B' of the above motherboard.

FIG. 4 is a vertical cross-sectional view that shows section B-B' of the above motherboard for backplane buses.

Motherboard 1 is a multilayer wiring board, including a first signal layer 40 that connects connector wiring, a first ground layer 41, a power supply layer (VDD) 42, a second signal layer 43, a second ground (GND) layer 44, and a third signal layer 45. These layers are each stacked via a dielectric layer. The ground layers here are subjected to grounding, and these are power supply layers in a broad sense. Each of these power supply layers in a broad sense has a function that supplies electric power with respect to direct-current (DC) components, and a function allowing a feedback current to flow with respect to alternating-current (AC) components.

A shape of the power supply layer 42 only is shown in FIG. 1. The power supply layer 42 is formed in substantially an entire region of the motherboard 1. Via holes for connector pin insertion, such as 100, 101, 102, 103, 104, are formed in the motherboard 1. The via holes 100 to 103 are not subjected to electrical connection to the power supply layer 42, and the three via holes are each formed centrally in a specific region generated by circularly removing a portion of the power supply layer 42. At the via hole 104, however, the power supply layer 42 and a metallized layer inside the via hole are connected directly to each other, whereby electrical connection is established between the power supply layer 42 and a connector pin inserted into the via hole 103. Other power supply layers (the first ground layer 41 and the second ground layer 44) are also substantially the same structure as that of the power supply layer 42.

At the second signal layer 43, conductor layers are left only in linear or island-shaped regions each formed between two via holes which require interconnection, and other regions are each filled in with a dielectric substance. Wiring patterns are formed in this way. Although only wiring patterns 20 and 22 are shown in FIG. 1, a larger number of wiring patterns are actually formed. The first signal layer 40 and third signal layer 45, neither being shown at all in FIG. 1, are also substantially the same structure as that of the second signal layer.

The region 51 of the power supply layer 42 that is associated with a region present between the mutually independent wiring patterns 20 and 22 of the signal layer 43 has an EBG pattern formed in lieu of a uniform conductor layer. The regions 52 and 53 shown in FIG. 1 are also EBG pattern regions formed similarly to the region 51.

Functions of the EBG pattern regions 51 to 53 are described next. The wiring pattern provided on the signal layer 43, conductors of the power supply layer 42 are ground layer 44 adjacent to the signal layer 43, and dielectrics interposed between these layers form a stripline structure. In other words, the conductors of the power supply layer 42 and ground layer 44 provide a pathway for a feedback current of a signal propagated through the wiring pattern 20, for example. The region unnecessary for use as the pathway of the feedback current, that is, the region associated with the region present between the mutually independent wiring patterns is used as an EBG pattern in lieu of a uniform power supply layer according to necessity for noise cutoff. Thus, the signal propagated in a particular frequency band is cut off and a noise cutoff effect can be obtained between the independent wiring patterns mentioned above. That is to say, the signal wiring improves in S/N ratio. These EBG patterns 51-53 and a uniform power supply layer present therearound are connected to each other in terms of DC. Thus, a capability to supply electric power from the via holes near each EBG pattern, via an associated connector, to a module present on a daughterboard, is essentially invariable, compared with an electric power supply capability of the motherboard utilizing the entire surface of a power supply layer as a uniform conductor. In other words, constancy of a supply potential is maintained and a reference voltage of the signal is supplied without a problem.

A vertical cross-sectional view of the motherboard 1 with a section denoted by discontinuous line A-A' is as shown in FIG. 2. Connectors 10-1 to 10-5 are mounted on the motherboard 1. Although mounting positions of the connectors 10-1 to 10-5 are each shown with a discontinuous line in FIG. 1, only the connector 10-1 mounted in close proximity to one array of via holes inclusive of the via hole 100 is shown in FIG. 2. Other connectors are omitted therefrom. Each connector connects a daughterboard to the internal wiring of the motherboard 1. Each daughterboard constitutes a module for a system assembled using the motherboard 1. Only daughterboard 30-1 mounted on a side face of the connector 10-1 is shown in FIG. 2. Also, compared with this connector and the daughterboard, the motherboard 1 is depicted in enlarged form in a direction of its thickness in FIG. 2.

In addition, it is shown in FIG. 2 that at the power supply layer 42 adjacent to the signal layer 43, the region 51 associated with the region present between the two independent wiring patterns 20 and 22 of the signal layer 43 forms an EBG pattern in lieu of the uniform conductors of other regions.

A reduction effect against noise coupling between the electrical lines of the signal layer 43 can likewise be obtained by forming an associated section of the second ground layer 44, not the power supply layer 42 itself, as an EBG pattern. The fact that as shown in FIG. 2, the layer to be taken as an EBG pattern was selected has further advantages. That is to say, the first ground layer 41 is present above the EBG pattern 51. Also, the second ground layer 44 is present below the pattern 51. therefore, the feedback current pathway of the wiring pattern provided on the first signal layer 40 is reserved at the first ground layer, and the feedback current pathway of the wiring pattern provided on the third signal layer 45 is reserved at the second ground layer 44. Thus, using the power supply layer 42 as an EBG pattern does not become a hindrance to the signal feedback current flowing through the wiring of the signal layer 40 or the wiring of the signal layer 45.

The first ground layer 42 shown in FIG. 3 also has EBG pattern regions 54, 56, and the like. These EBG pattern regions are described below with reference to FIG. 3 and FIG. 4 which is a vertical cross-sectional view of section B-B'.

At the first ground layer 41, the region 54 associated with a region present between independent wiring patterns 23 and 24 of the first signal layer 40 forms an EBG pattern. Wiring patterns of the first signal layer 40, other than the wiring patterns 23 and 24, are omitted from FIG. 3 as well, but similarly to the above, EBG pattern 56 is also associated with a region present between the independent wiring patterns of the first signal layer 40. In addition, these EBG patters are connected to a uniform conductor of the ground layer 41.

The wiring of the first signal layer 40, the conductor of the first ground layer 41, and the dielectric located between these two layers work together to form a microstripline. This means that the first ground layer provides a pathway for the feedback current of the signal passing through the wiring. The EBG pattern is provided in a region present between the wiring patterns of the signal layer, not in the wiring pattern regions themselves. In other words, the ground layer directly below the wiring is a uniform conductor without splits or grooves, so this ground layer does not become a hindrance to the feedback current. At the same time, since an EBG pattern exists in the region between the wiring 23 and the wiring 24, the noise propagation therebetween is suppressed in a cutoff frequency band of the EBG pattern.

Next, an electromagnetic shielding effect of EBG patterns and variations of these patterns will be described with reference to FIGS. 5 to 9.

Figure 5:
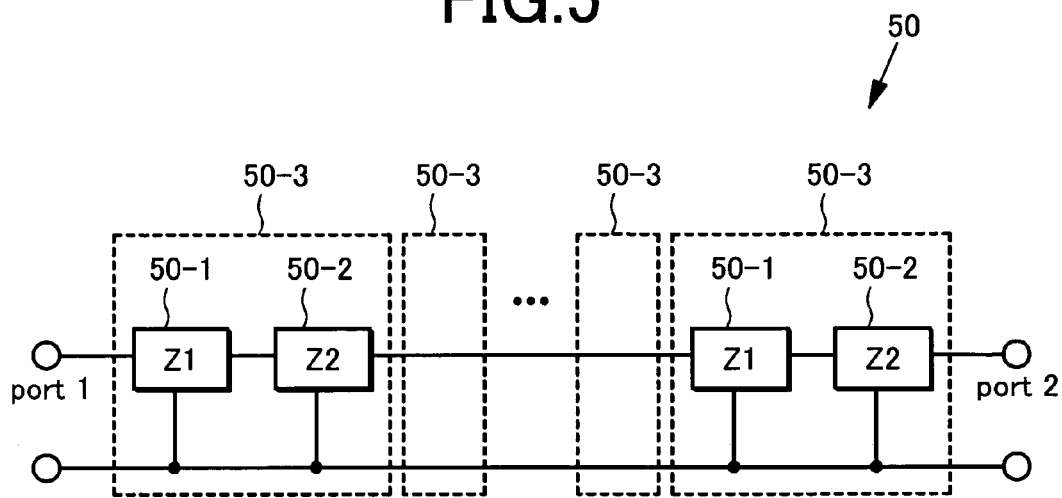
FIG. 5 shows an equivalent circuit composed by simplifying a two-dimensional EBG pattern into a one-dimensional model.

FIG. 5 shows an equivalent circuit composed by simplifying a two-dimensional EBG pattern into a one-dimensional model.

Figure 6:
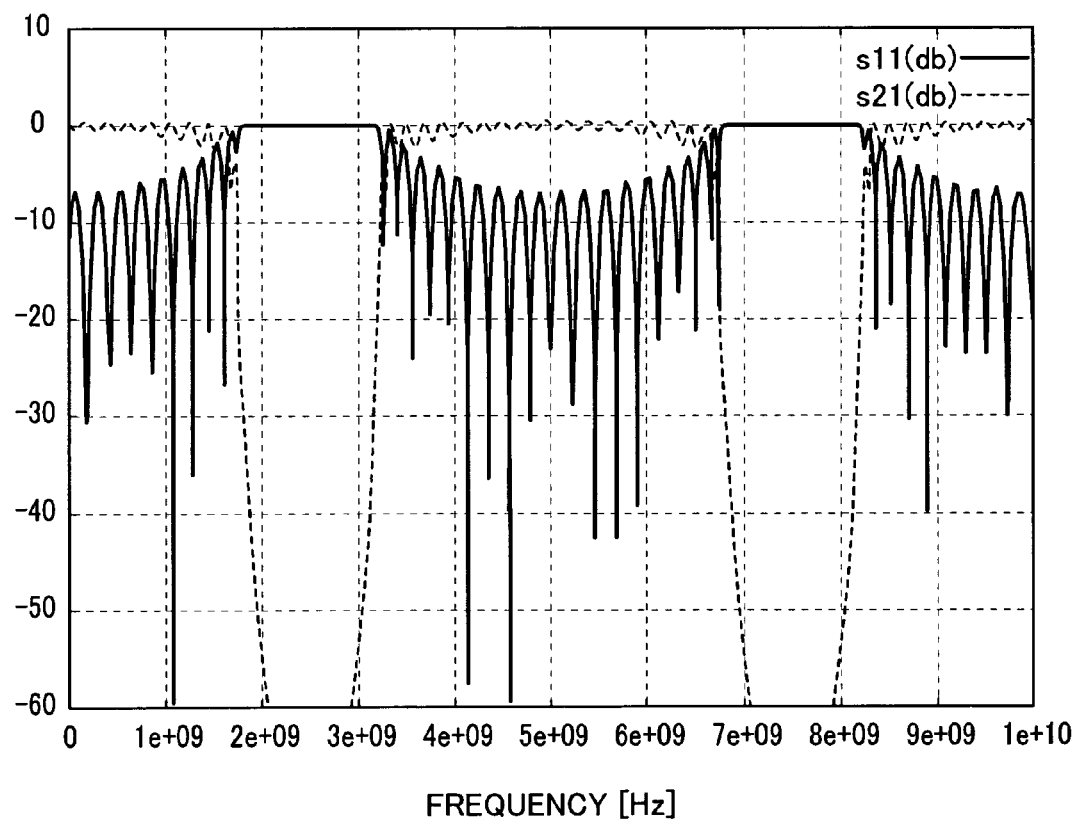
FIG. 6 is a graph showing the relationships between power supply noise propagation ratios and return losses for each frequency of the above EBG pattern.

FIG. 6 is a graph showing the relationships between power supply noise propagation ratios and return losses for each frequency.

Figure 7:
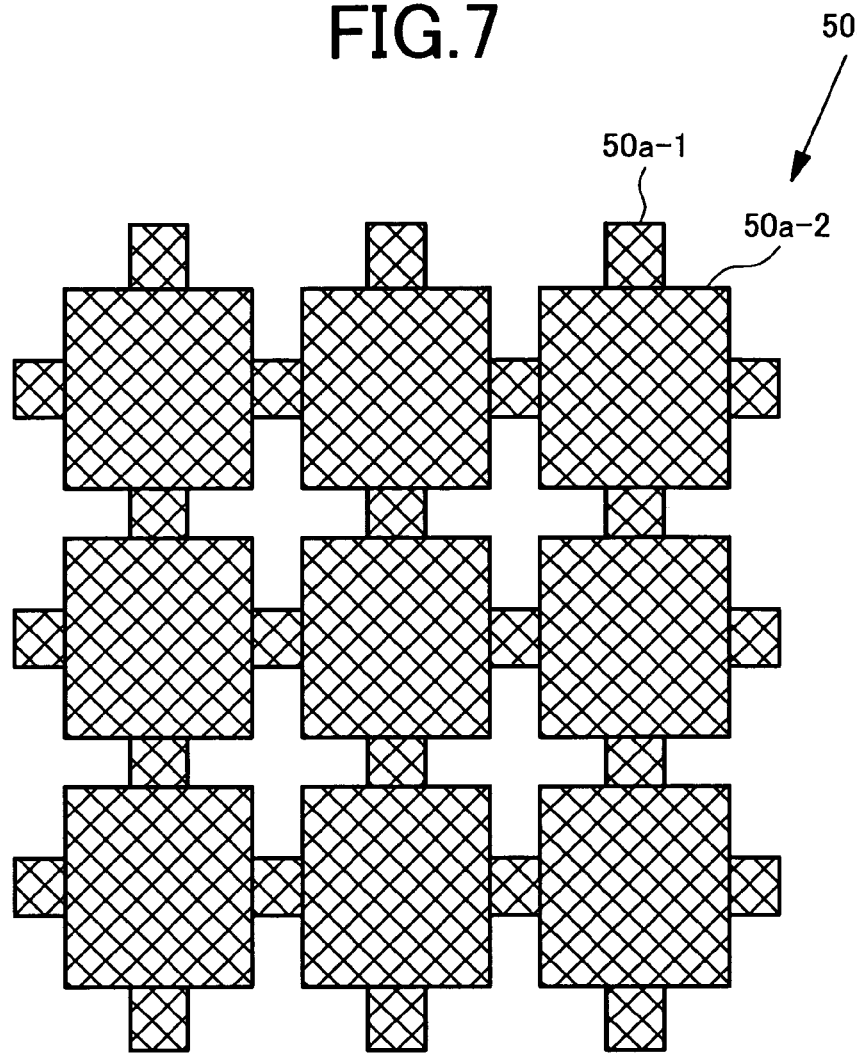
FIG. 7 is a plan view of an EBG pattern adoptable in an example.
Figure 8:
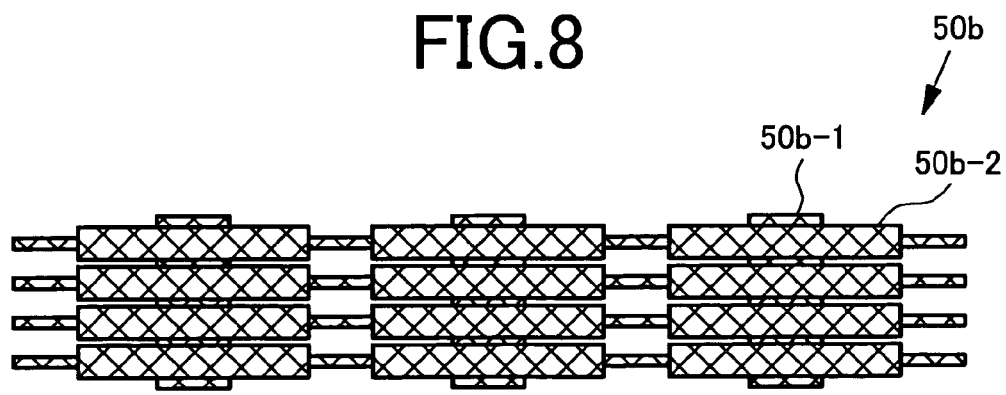
FIG. 8 is a plan view of another EBG pattern adoptable in an example.
Figure 9:
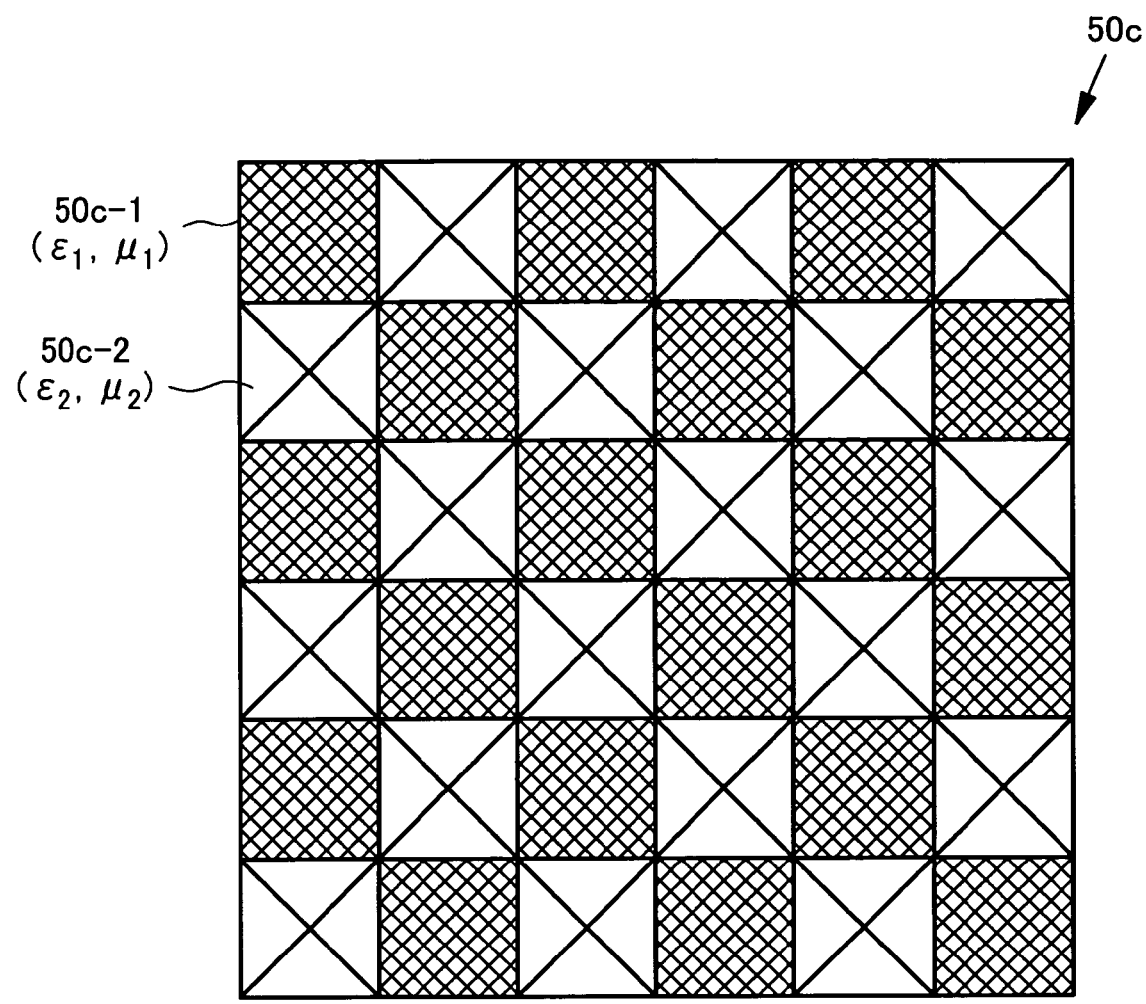
FIG. 9 is a plan view of yet another EBG pattern adoptable in an example.

FIGS. 7 to 9 are configuration diagrams of different EBG patterns.

Suppose that as shown in FIG. 5, two wiring patterns 50-1 and 50-2 have impedances Z1 and Z2, respectively, and that the patterns are periodically arrayed as units 50-3. Applying a voltage (V1) to a port 1 propagates a voltage (V2) to a port 2, and these voltages determine the power supply noise propagation ratio (S21) shown in following expression (1):

$$S21=V2/V1 \ldots \text{(Expression 1)}$$

FIG. 6 shows the power supply noise propagation ratio (S21) obtained when Z1=5 Ω, Z2=2 Ω, and both Z1 and Z2 are 100 picoseconds (ps) in terms of propagation delay time. The power supply noise propagation ratio (S21) is denoted by a dotted line, and a reflection coefficient (S11) indicating a return loss is denoted by a solid line. In FIG. 6, a reference impedance of S-parameters is 5 Ω. As can be seen from FIG. 6, a 2-3 GHz (shown as a "2e+09" to "3e+09" interval on a horizontal axis), the power supply noise propagation ratio (S21) is as small as below −50 dB, and the reflection coefficient (S11) is almost 0 dB, that is, denotes total reflection. It can be seen, therefore, that a cutoff frequency band of high attenuation ratios can be constructed by periodically arranging two wiring patterns of different impedances.

For this reason, an electromagnetic shielding effect can be generated by forming a small square pattern 50a-1 and a large square pattern 50a-2 into alternate arrangement form in at least three arrays, as shown in FIG. 7. The small square pattern 50a-1 and large square pattern 50a-2 here have different impedance with respect to alternating current.

Alternatively, combining patterns each different in aspect ratio by a factor of at least three, as shown in FIG. 8, makes it possible to vary cutoff frequency bands of the signals propagated vertically and horizontally. That is because, since vertical and horizontal fundamental modes of the electromagnetic waves propagated between rectangular or square power supply layers (i.e., resonance modes of a minimum frequency) are independent of each other, respective cutoff frequency bands can be degenerated (simplified) as in FIG. 6, and thus because the cutoff frequency bands can be selectively varied by constructing each thereof using such rectangular patterns 50b-1 and 50b-2 as shown in FIG. 8.

Further alternatively, square patterns each having the same size and different in relative permittivity "ε" and in magnetic permeability "μ" may be usable to construct the cutoff frequency bands. In this case, pattern 50c-1 has relative permittivity "$\varepsilon_1$" and magnetic permeability "$\mu_1$", pattern 50c-2 has relative permittivity "$\varepsilon_2$" and magnetic permeability "$\mu_2$", and both of the patterns differ in impedance.

Second Embodiment

A second embodiment according to the present invention will be described hereunder with reference to FIGS. 10, 11.

Figure 10:
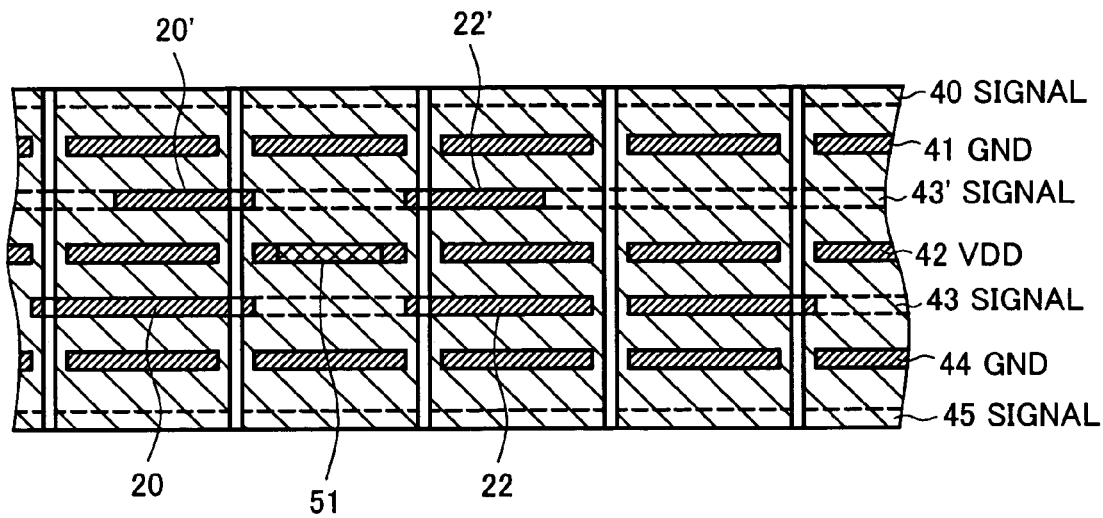
FIG. 10 is a vertical ross-sectional view of a motherboard for backplane buses according to a second embodiment of the present invention.

FIG. 10 is a vertical cross-sectional view of a motherboard for backplane buses according to the second embodiment, showing a section extending along an array of via holes.

In the present embodiment, a signal layer 43' is added to the layer configuration shown in FIG. 2. The present embodiment is exactly the same as the first embodiment of FIGS. 1 to 4, except that a power supply layer 42 is formed as an EBG pattern only in an associated region 51 between independent electrical lines 20, 22 of a second signal layer 43. The region 51 is also a region present between independent wiring patterns 20' and 22' of the added signal layer 43'. The EBG pattern of the region 51, therefore, is also effective for cutting off noise between the electrical lines 20', 22' of the added signal layer 43'.

Noise between independent signal nodes can be cut off similarly at both sides of the signal layers 43, 43' respectively provided below and above the power supply layer 42 with an EBG pattern formed in the above way.

Figure 11:
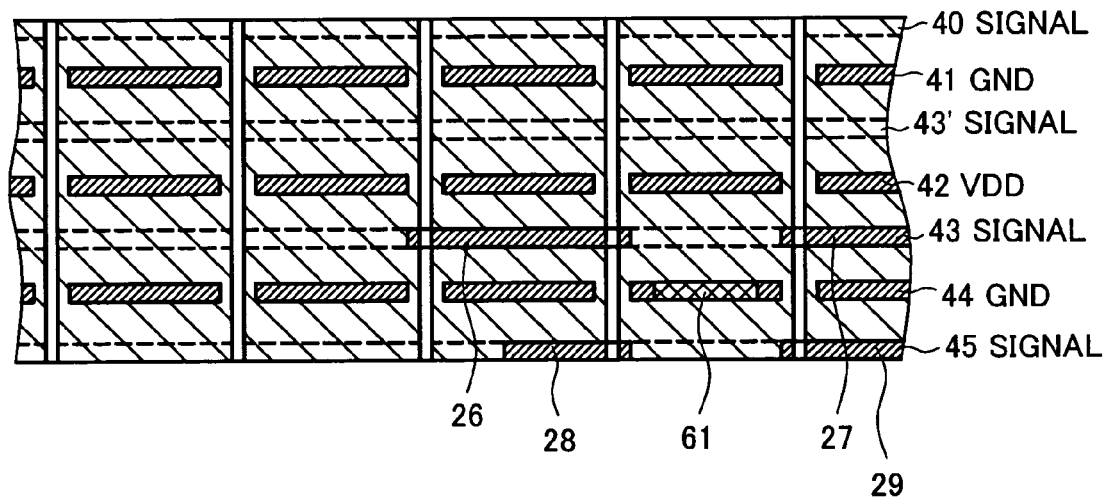
FIG. 11 is a vertical cross-sectional view that shows another section of the above motherboard.

FIG. 11 is a vertical cross-sectional view of the motherboard for backplane buses according to the second embodiment, showing a section extending along another array of via holes. A region 61 forming a portion of a second ground layer 44 in the motherboard is also changed from a uniform conductor layer into an EBG pattern. The second ground layer 44 is a feedback current pathway for a signal which passes through wiring patterns of the signal layer 43, and also a feedback current pathway for a signal which passes through wiring patterns of a signal layer 45. The EBG pattern 61 of the ground layer 44, therefore, is effective for cutting off noise between wiring patterns 26 and 27 of the signal layer 43, and at the same time, can also provide a similar effect with respect to noise cutoff between wiring patterns 38 and 29 of the signal layer 45.

Third Embodiment

A third embodiment according to the present invention will be described hereunder with reference to FIGS. 12, 13.

Figure 12:
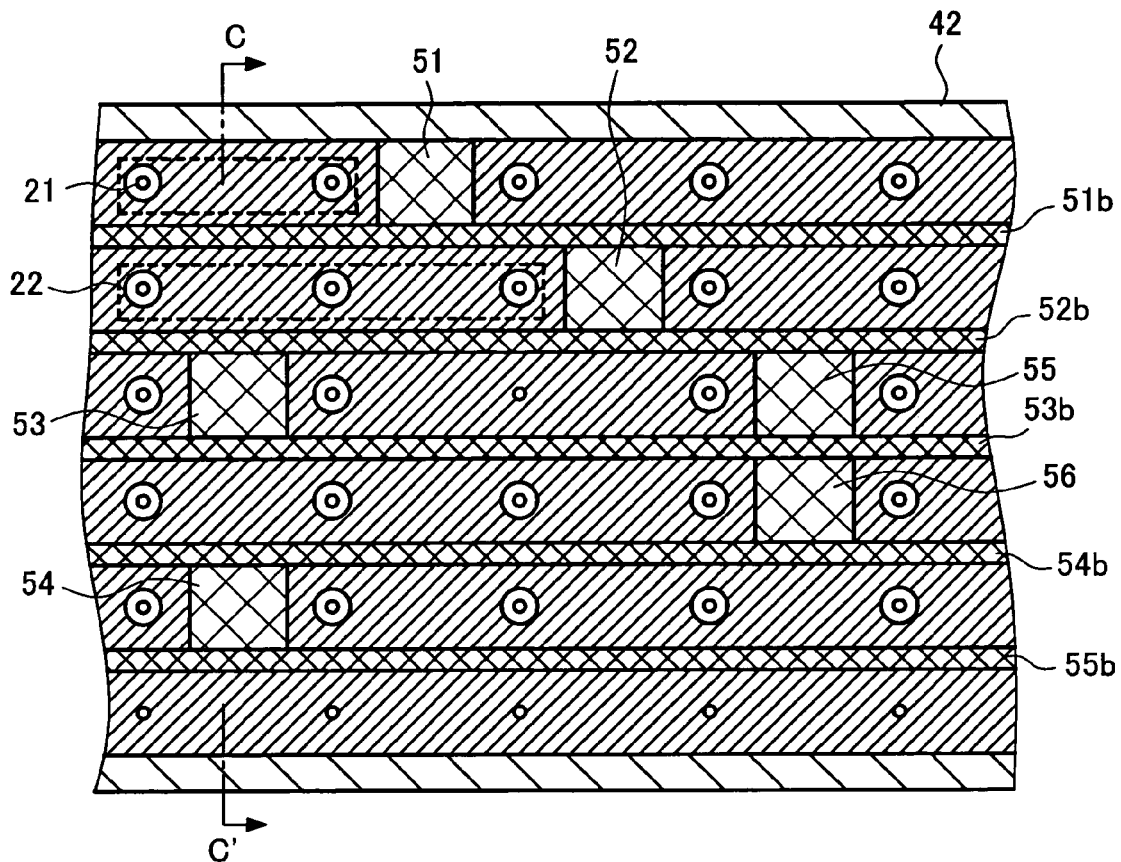
FIG. 12 is a partial cross-sectional view showing a ground layer of a motherboard for backplane buses according to a third embodiment of the present invention.

FIG. 12 is a horizontal cross-sectional view showing in part a power supply layer 42 of a motherboard for backplane buses according to the third embodiment.

Figure 13:
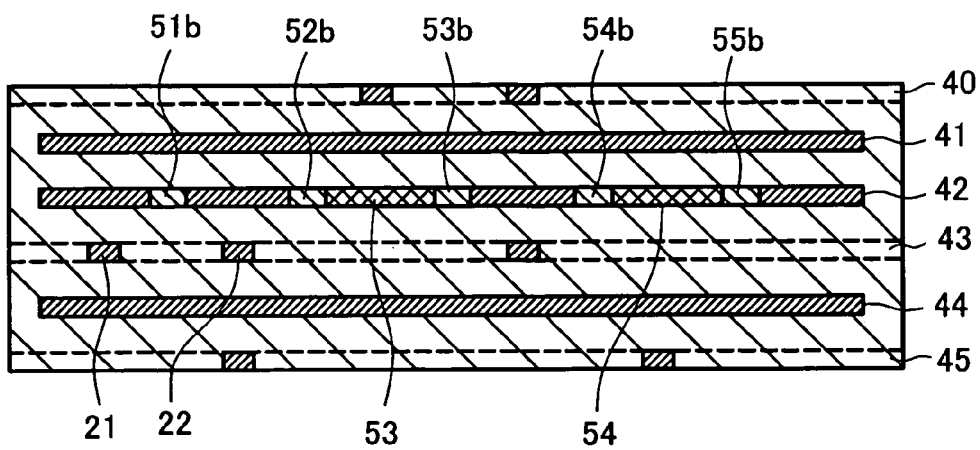
FIG. 13 is a vertical cross-sectional view of section C-C' of the above motherboard.

FIG. 13 is a vertical cross-sectional view of section C-C' of the above motherboard.

In addition to EBG patterns similar to those described in FIGS. 1, 2, the power supply layer 42 in the motherboard of the present embodiment has EBG patterns 51b, 52b, 53b, 54b, 55b, each of these patterns extending in a horizontal direction of FIG. 12. A majority of wiring patterns formed on the signal layer 43 extend horizontally to interconnect the pins located at the same positions in different connectors, and these patterns resemble, for example, wiring patterns 20, 21 of FIG. 12. The EBG patterns 51b, 52b, 53b, 54b, 55b are effective for cutting off the noise propagated between the above wiring patterns. The EBG patterns 51b to 55b each differ in aspect ratio by a factor of at least three, for example. The EBG patterns 51b to 55b can also be such periodically arranged square EBG patterns of different sizes as shown in FIG. 7.

Fourth Embodiment

Figure 14:
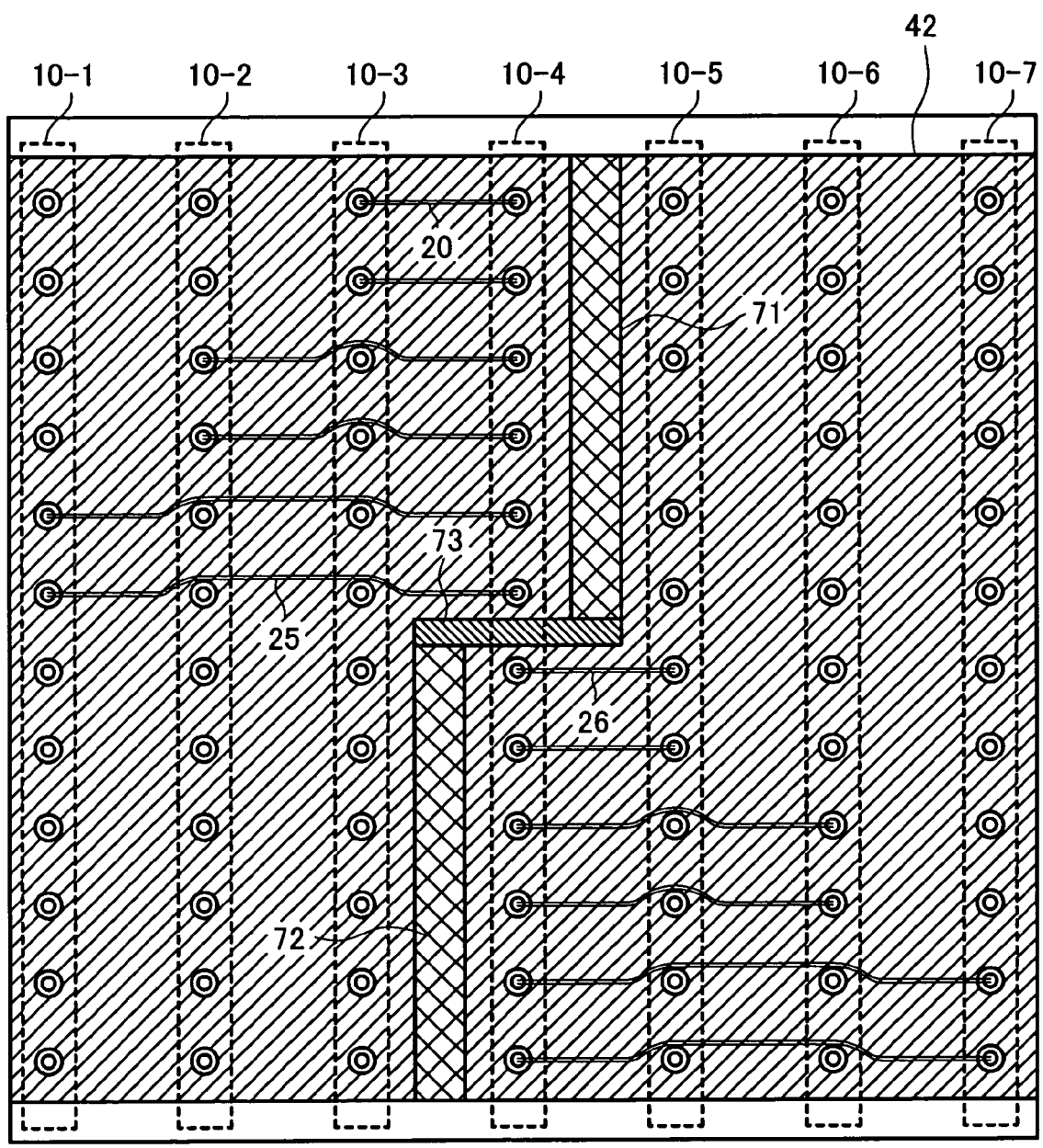
FIG. 14 is a horizontal cross-sectional view showing in part a ground layer 42 of a motherboard for backplane buses according to a fourth embodiment of the present invention.

FIG. 14 is a horizontal cross-sectional view showing in part a power supply layer 42 of a motherboard for backplane buses according to a fourth embodiment. A stacked structure of this motherboard in a direction of its thickness is essentially the same as that of the motherboard of the first embodiment shown in FIGS. 1 to 4.

The present embodiment is suitable for a system in which, among all modules mounted at connectors of the motherboard, only a module connected to a connector 10-4 performs a function of a crossbar switch. The connector 10-4 is connected to all other connectors 10-1 to 10-3, 10-5 to 10-7, via wiring patterns 20, 25, 26, and/or other portions of signal layers adjacent to the above-mentioned power supply layer 42. When viewed from top, an EBG pattern 71 is located to the right of the wiring routed to the left of the drawing with respect to the connector 10-4, and an EBG pattern 72 is, conversely, located to the left of the wiring routed to the right of the drawing with respect to the connector 10-4. In addition, an EBG pattern 73 is located so as to provide intercepts between the EBG patterns 71, 72 and between the wiring patterns 25, 26. Constructing the motherboard in this fashion allows the EBG pattern 71 to cut off the power supply noise propagated from the right of the connector 10-4 to a signal developed at the left of the connector 10-4. Also, the EBG pattern 72 can cut off the power supply noise propagated from the left of the connector 10-4 to a signal developed at the right of the connector 10-4. In addition, the EBG pattern 73 can cut off power supply noise between both right and left signal ports of the connector 10-4. In the present embodiment, it is also possible to cut off external power supply noise without obstructing a flow of feedback currents of these signals, and hence to improve S/N ratios of the signals. In addition, the S/N ratios can, of course, be further improved by arranging such EBG pattern 50b as shown in FIG. 8, between signal ports.

Fifth Embodiment

A fifth embodiment according to the present invention will be described hereunder with reference to FIG. 15.

Figure 15:
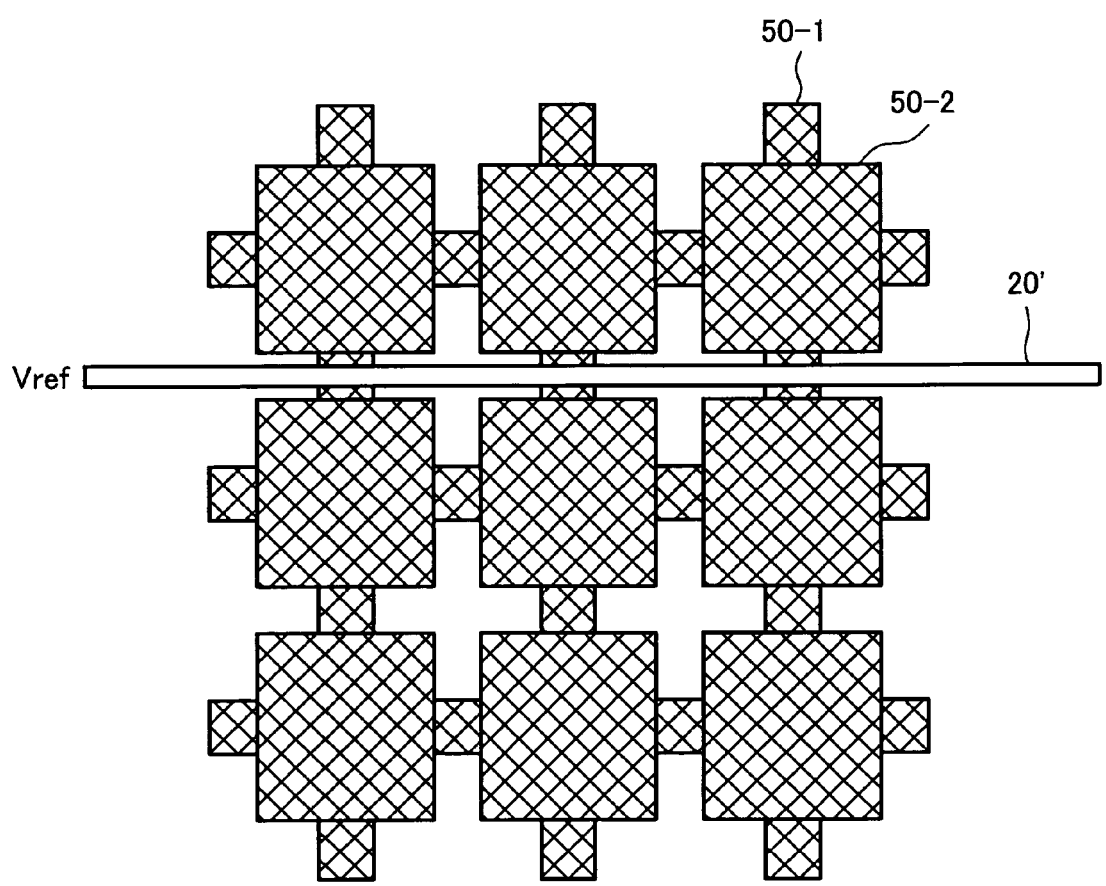
FIG. 15 is a view in which EBG patterns are each used as a noise filter for high-frequency-band signals with respect to reference voltage wiring.

FIG. 15 is a view in which EBG patterns are each used as a noise filter for high-frequency-band signals with respect to reference voltage wiring.

The present embodiment is an example in which signal wiring is disposed on a layer adjacent to an EBG pattern. The signal wiring 20' shown in back-on-white rectangular form is disposed directly above an EBG pattern 50-1 or 50-2 or directly below the pattern. On the wiring 20', as described using the graph of FIG. 6, propagation of signals for the right or left of FIG. 15 is blocked in a specific frequency band. Using this signal wiring 20' for a reference voltage (ref) of a receiver (signal-receiving side of a module), therefore, allows external noise to be suppressed. It is possible, by adopting this construction, to use the above EBG pattern as a noise filter for high-frequency-band signals. Also, applying this noise filter to the reference voltage for the receiver means that since the reference voltage must be distributed to various modules particularly at low noise levels, such application is a preferred embodiment.

Examples of a Motherboard for Backplane Buses that uses EBG Patterns

Finally, examples of an EBG-pattern-based motherboard for backplane buses of the present invention will be described with reference to FIGS. 16 to 18.

Figure 16:
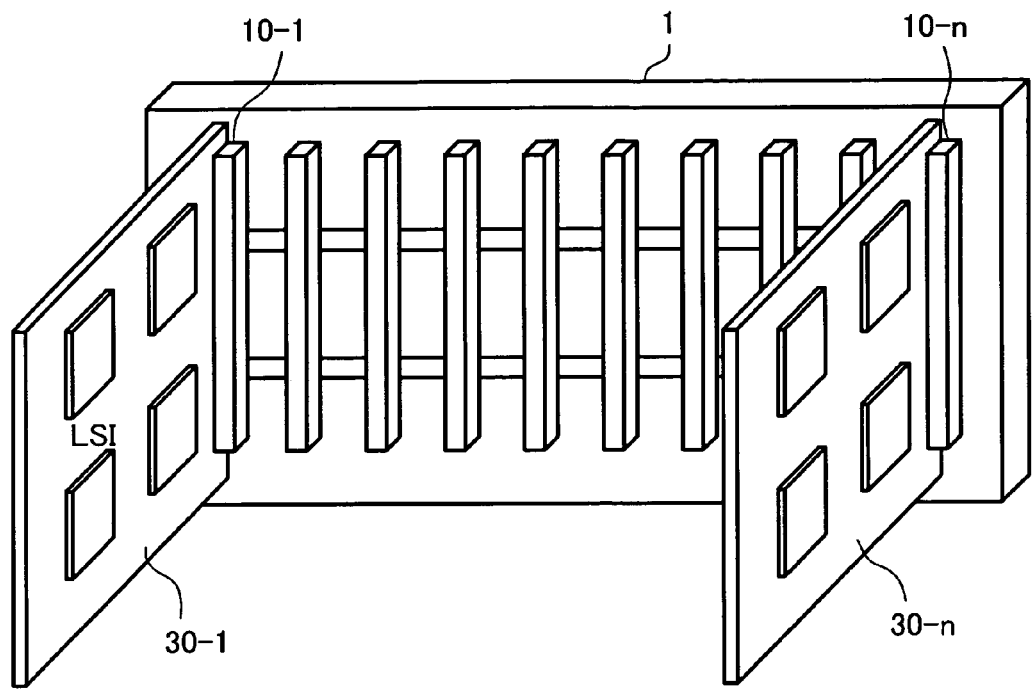
FIG. 16 is a perspective view of an EBG-pattern-based motherboard and modules mounted thereon.

FIG. 16 is a perspective view of an EBG-pattern-based motherboard and modules mounted thereon.

Figure 17:
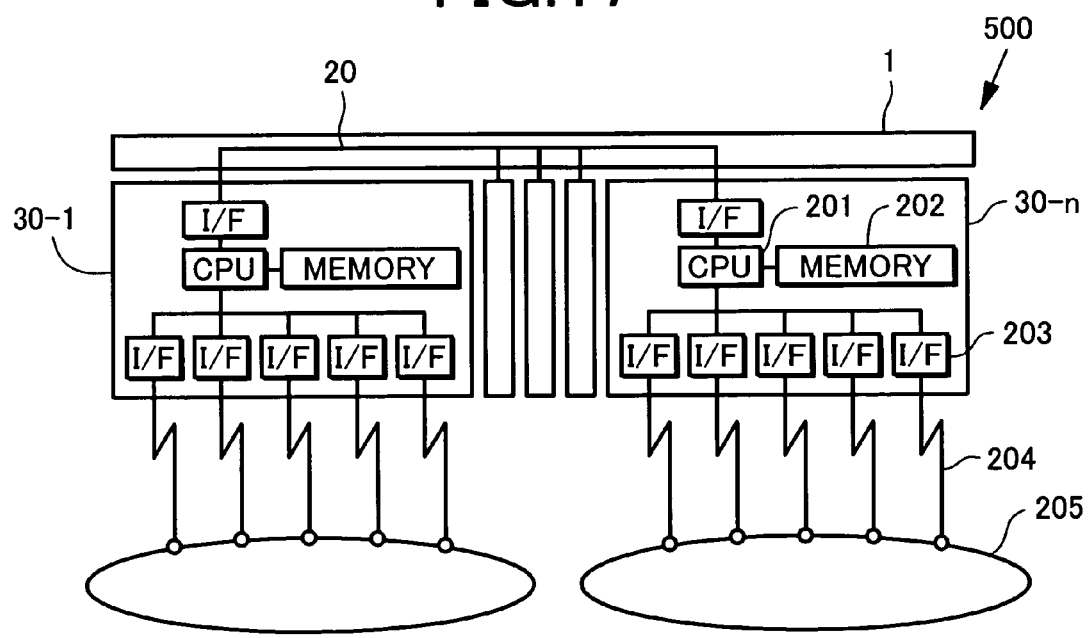
FIG. 17 is a connection diagram of a router using an EBG-pattern-based motherboard.

FIG. 17 is a connection diagram of a router using an EBG-pattern-based motherboard.

Figure 18:
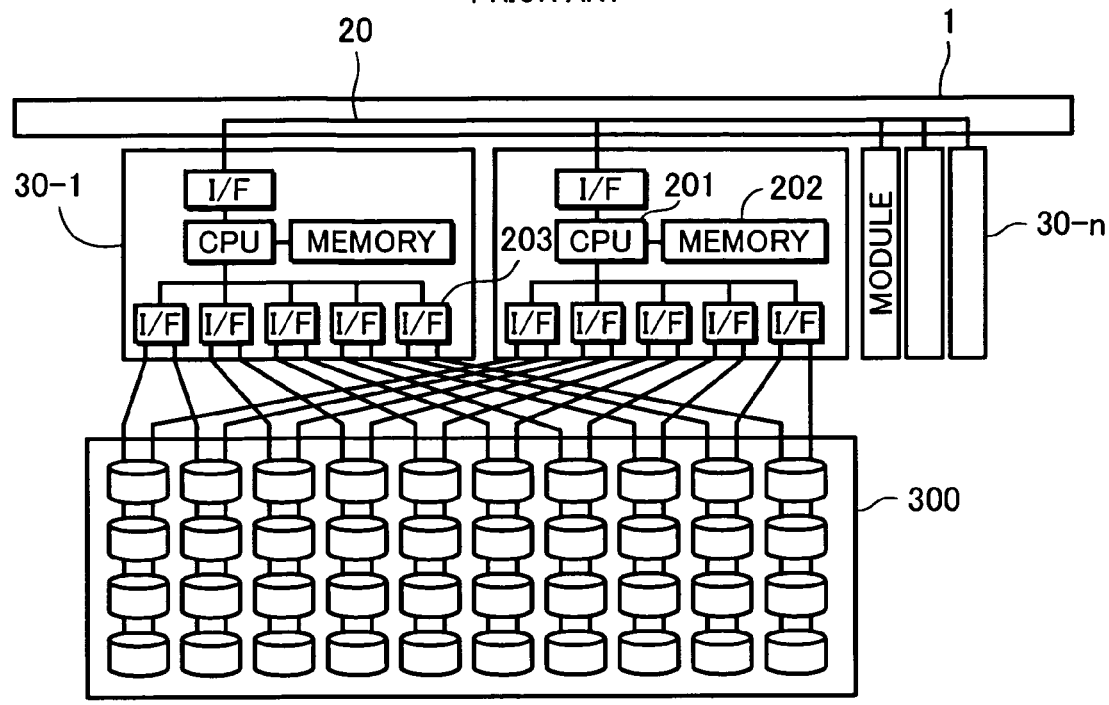
FIG. 18 is a connection diagram of a Redundant Array of Independent Disks (RAID) system using an EBG-pattern-based motherboard.
Figure 19:
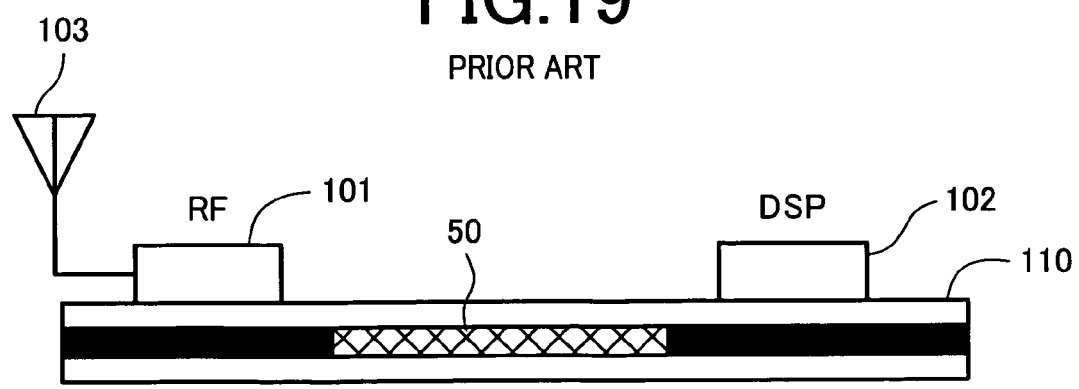
FIG. 19 is a cross-sectional view of an analog-to-digital signal mixed circuit board for signal-to-signal noise cutoff, based on a conventional technique.
Figure 20:
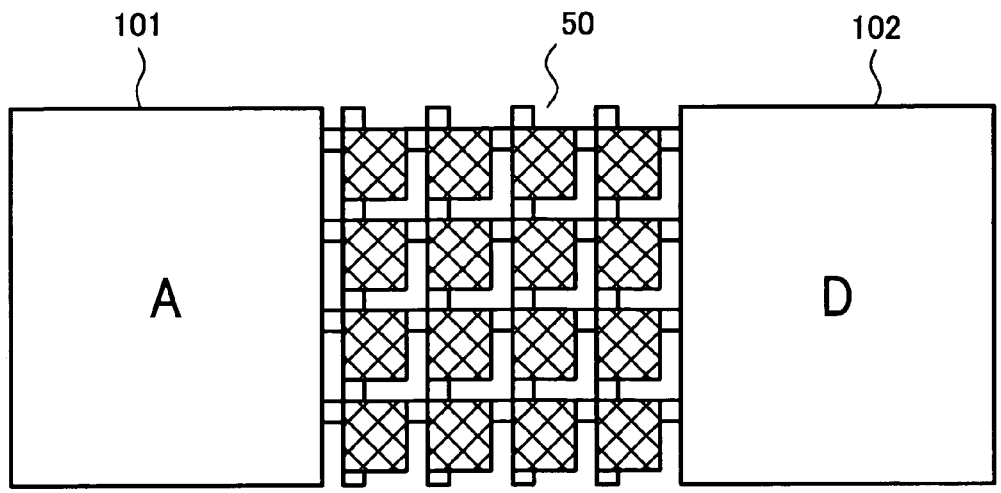
FIG. 20 is a top view of a power supply layer of the analog-to-digital signal mixed circuit board for signal-to-signal noise cutoff, based on the conventional technique.
Figure 21:
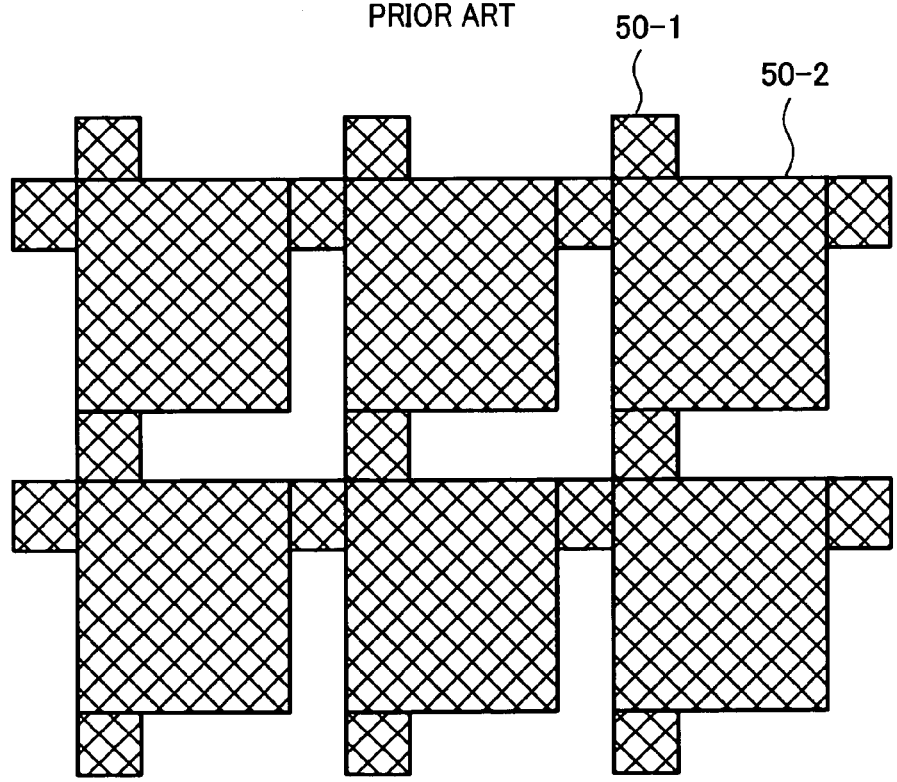
FIG. 21 is a view showing an EBG pattern of the above analog-to-digital signal mixed circuit board for cutting off signal-to-signal noise.
Figure 22:
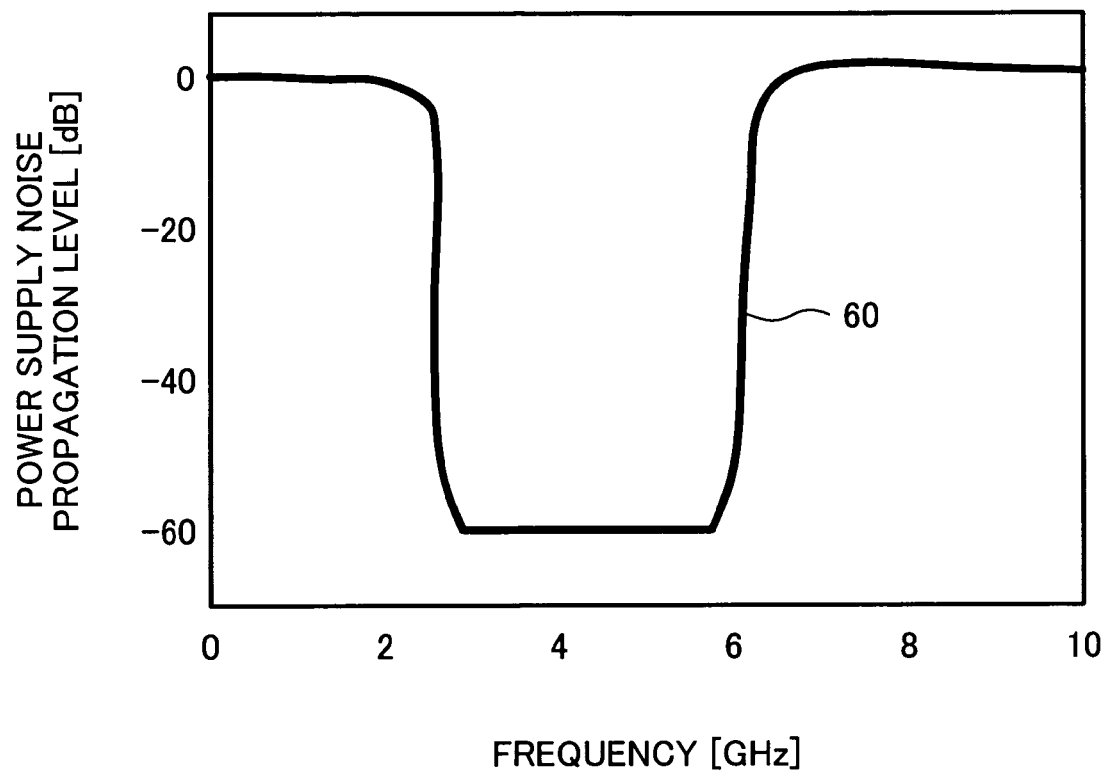
FIG. 22 is a graph that represents power supply noise propagation levels in a certain frequency band, or propagation losses between analog part and digital part.

FIG. 18 is a connection diagram of a RAID system using an EBG-pattern-based motherboard.

The motherboard 1 shown in FIG. 16 is a motherboard for backplane buses, and is a circuit board whose signal-to-signal power supply noise is reduced using the EBG patterns described in any one of the First to Fifth Embodiments. This motherboard has an "n" number of connectors mounted thereon as connectors 10-1 to 10-n, and modules 30-1 to 30-n are connected to the connectors 10-1 to 10-n, respectively.

The motherboard 1 when applied to a router is shown in FIG. 17. The motherboard 1 has the modules 30-1 to 30-n connected via wiring 20, and employs such EBG patterns as described in the above embodiments. Thus, signal-to-signal noise propagation is suppressed in a cutoff frequency band and S/N ratios are improved. A processor (CPU) 201, a memory 202, and an interface circuit 203 are mounted on the module 30-1, which is connected from the interface circuit 203 to a global network 205 via a cable 204. The interface circuit 203 receives data from the interface circuit 204, and the CPU 201 calculates a destination network from a header of the data. The data is then transmitted through the internal wiring of the motherboard 1 so as to reach an interface circuit 203 formed inside an associated module. Since internal signals of the motherboard 1 have a high S/N ratio, data of higher throughput can be transmitted.

An example of applying this motherboard to a RAID system is shown in FIG. 18. In a configuration diagram of FIG. 18, a disk array 300 with hard-disk drives (HDDs) constructed in array form is connected to modules 30-1 to 30-n. The disk array 300 is connected to form a duplex system for enhanced reliability.

The modules 30-1 to 30-n are connected to the motherboard 1 via wiring 20, and the EBG patterns described in the above embodiments are formed on the motherboard 1. Thus, signal-to-signal noise propagation is suppressed in a cutoff frequency band and S/N ratios are improved. A processor (CPU) 201, a memory 202, and a interface circuit 203 are mounted on the module 30-1, which is connected from the interface circuit 203 to the HDDs.

Data read/write operations are rapidly performed on the appropriate HDD of the disk array 300 via any one of modules 30-1 to 30-n that communicates with a host assigned to that module. During the read/write operations, the module with the CPU 201 mounted therein calculates redundant bits from the data, whereby calculations are performed to identify the HDD onto which the data is to be stored. The data is then transmitted through the internal wiring 20 of the motherboard 1 so as to reach an interface circuit 203 formed inside that associated module. Since internal signals of the motherboard 1 have a high S/N ratio, data of higher throughput can be transmitted.

As set forth above, the EBG-pattern-based motherboard of the present invention that blocks signal-to-signal noise propagation without obstructing a flow of feedback current can improve signals in S/N ratio. The present invention can be used not only for backplane buses, but also for a circuit board to which a large number of general modules are connected, and essentially the same effect can be obtained in the invention.

What is claimed is:

1. A multi-layer main board for mounting a plurality of sub-boards and providing them with backplane buses, the main board comprising:
   a signal layer including a plurality of islands made of conductive material used as signal wirings which survive a patterning process; and
   a power supply layer formed in parallel with said signal layer and upon an inserting layer of an insulator, conductive regions being dominant therein even though conducting material is partly removed by a patterning process;
   wherein a specific area of said power supply layer, which is corresponding to a buffer area of said signal layer between signal lines or signal line groups, noise separation being needed therebetween, has a periodic wiring structure in which a pattern formed up of two wiring regions of different impedances is periodically disposed in at least three arrays.

2. The main board for backplane buses according to claim 1, wherein one of the two wiring regions of different impedances in the periodic wiring structure is formed into a large square form and the other wiring region is formed into a small square form.

3. The main board for backplane buses according to claim 1, wherein one of the two wiring regions of different impedances in the periodic wiring structure is formed into a large rectangular form and the other wiring region is formed into a small rectangular form.

4. The main board for backplane buses according to claim 1, wherein the periodic wiring structure is formed at a section of the power supply layers, the power supply layer section being adjacent to a section between parallel sets of signal wiring of the signal layers.

5. The main board for backplane buses according to claim 1, comprising at least three connectors, wherein:
   to a central connector having at least one connector installed at least at left and right sides of the central connector, all other connectors on the motherboard are connected at a certain signal layer;
   signal wiring to the connector(s) installed at the left side, and signal wiring to the connector(s) installed at the right side are separated vertically with respect to and at the central connector; and
   inside a power supply layer adjacent to the signal layer;
   a first periodic wiring structure is formed at a section of a power supply layer present between the central connector and the connector(s) installed to the immediate right of the central connector, wherein the power supply layer section with the first periodic wiring structure formed thereat is adjacent to a section of the signal layer, the section being other than that formed with the signal wiring to the connector(s) installed at the left side of the central connector,
   a second periodic wiring structure is formed at a section of a power supply layer present between the central connector and the connector(s) installed to the immediate left of the central connector, wherein the power supply layer section with the second periodic wiring structure formed thereat is adjacent to a section of the signal layer, the section being other than that formed with the signal wiring to the connector(s) installed at the right side of the central connector, and
   a third periodic wiring structure is formed at a power supply layer section adjacent to the section at which the two sets of signal wiring are separated vertically with respect to and at the central connector, the power supply layer section being adjacent to a section between parallel signal lines.

6. The multi-layer main board according to claim 1, further comprising another power supply layer at an opposite side to said signal layer, which is formed in parallel with said power supply layer and upon another inserting layer of insulator.

7. The multi-layer main board according to claim 1, further comprising another signal layer at an opposite side to said signal layer, which is formed in parallel with said power supply layer and upon another inserting layer if insulator.

8. A multi-layer main board for mounting a plurality of sub-boards and providing them with backplane buses, the main board comprising:
   a signal layer including plurality of islands made of conductive material used as signal wirings which survive a patterning process; and a power supply layer formed in parallel with said signal layer and upon an inserting layer of insulator, conductive regions being dominant therein even through conducting material is partly removed by a patterning process;

wherein a specific area of said power supply layer, which is corresponding to a buffer area of said signal layer separating one signal wiring into two parts at the middle of said signal wiring, has a periodic wiring structure in which a pattern formed up of two wiring regions of different impedances is periodically disposed in at least three arrays.

* * * * *